United States Patent [19]

Shindo et al.

[11] Patent Number: 5,449,933
[45] Date of Patent: Sep. 12, 1995

[54] FERROELECTRIC THIN FILM ELEMENT

[75] Inventors: Satoshi Shindo, Nagaokakyo; Toshio Ogawa, Iwata; Atsuo Senda, Ohtsu; Tohru Kasanami, Tsuzuki, all of Japan

[73] Assignee: Murata Mfg. Co., Ltd., Japan

[21] Appl. No.: 39,842

[22] Filed: Mar. 30, 1993

[30] Foreign Application Priority Data

Mar. 31, 1992 [JP] Japan ................... 4-077171

[51] Int. Cl.6 ............ H01L 29/04; H01L 27/22; H01L 23/48
[52] U.S. Cl. .................... 257/295; 257/64; 257/65; 257/627; 257/761; 365/109; 365/117
[58] Field of Search ............ 257/295, 627, 64, 65, 257/761; 365/109, 117, 527, 627

[56] References Cited

U.S. PATENT DOCUMENTS 5,088,002 2/1992 Ogawa .................... 257/771

FOREIGN PATENT DOCUMENTS 162369 1/1986 Japan.
3108759 5/1991 Japan .................... 365/117

OTHER PUBLICATIONS

Kidoh et al., "Ferroelectric properties of Pb-Zr-Ti films prepared by laser ablation", Appl. Phys. Lett., 58(25), 24 Jun. 1991, pp. 2910-2912.

Primary Examiner—Sara W. Crane
Assistant Examiner—Valencia Martin Wallace
Attorney, Agent, or Firm—Ostrolenk, Faber, Gerb & Soffen

[57] ABSTRACT

A ferroelectric thin film element 1 constructed by forming a MgO thin film 3 oriented in the direction (100), a lower electrode 4 composed of an alloy thin film of a Ni—Cr—Al system oriented in the direction (100), a ferroelectric thin film 5 composed of a $PbTiO_3$ thin film oriented in the direction (111), and an upper electrode 6 in this order on a substrate composed of (100) silicon 2.

10 Claims, 1 Drawing Sheet

FERROELECTRIC THIN FILM ELEMENT

BACKGROUND OF THE INVENTION

1. Field of the Invention

The present invention relates to a ferroelectric thin film element constructed by forming a ferroelectric thin film on a substrate, for example, to a ferroelectric thin film element suitable for use for a nonvolatile memory, a pyroelectric type infrared sensor and the like.

2. Description of the Prior Art

A ferroelectric thin film element using a ferroelectric material of a lead titanate system or a lead titanate zirconate system is applied to a nonvolatile memory utilizing ferroelectric characteristics, an infrared sensor utilizing pyroelectric characteristics, and the like. This type of ferroelectric thin film element has a structure in which a lower electrode is formed on a substrate, a ferroelectric thin film is formed on the lower electrode by a thin film forming process such as sputtering, and an upper electrode is further formed on the ferroelectric thin film.

Meanwhile, in order to sufficiently exhibit the material characteristics of the ferroelectric thin film, it is necessary to make the crystal orientation of the ferroelectric thin film equal to the direction of an easy polarization axis, that is, a spontaneous polarization axis of the thin film. When the crystal orientation of the ferroelectric thin film is made equal to the direction of the spontaneous polarization axis of the thin film, it is possible to, for example, reduce the volume change of the thin film in the case of applying alternating pulse cycles to the polarization, thereby to make it possible to prevent the fatigue of the material characteristics.

One example of the above described ferroelectric thin film element is disclosed in Japanese Patent Laid-Open Gazette No. 162369/1987. This document discloses a structure in which a MgO thin film oriented in the direction (100) is formed on a silicon substrate oriented in the direction (100), a lower electrode composed of Pt is formed on the MgO thin film, and a PbTiO$_3$ thin film having a spontaneous polarization axis in the direction of a c axis, that is, in the direction (001) is formed on the lower electrode.

In order to exhibit the characteristics of the ferroelectric thin film, the ferroelectric thin film must have a crystalline structure of a perovskite phase. Consequently, in forming the ferroelectric thin film, the temperature of the thin film must be increased to temperatures in excess of the crystallizing temperature of the thin film, that is, approximately 500° C. In this case, the lower electrode formed beneath the ferroelectric thin film is similarly heated. Consequently, a material superior in high-temperature stability is required as a material composing an electrode used in the dielectric thin film. Conventionally, an electrode composed of Pt has been widely used.

The electrode composed of Pt is superior in oxidation resistance under high temperatures and is low in reactivity with the ferroelectric thin film. When a structure in which the ferroelectric thin film is interposed between upper and lower electrodes composed of Pt is formed, however, a short is liable to occur between the upper and lower electrodes.

In order to solve the above described problem of the electrode composed of Pt, an electrode composed of an alloy thin film of Ni—Cr—Al alloy or an alloy thin film of Ni—Al alloy has been proposed (Japanese Patent Laid-Open Gazette No. 276615/1991). When the electrode composed of the above described alloy thin film is formed on a silicon substrate, the electrode reacts with the silicon substrate at a temperature at which a ferroelectric thin film is formed, to form a Ni—Cr—Al—Si compound or a Ni—Al—Si compound. Accordingly, the electrode composed of the alloy thin film may, in some cases, fail to function as an electrode.

Furthermore, in order to prevent the reaction between the electrode and the silicon substrate, it is considered that an amorphous SiO$_2$ layer commonly used as a surface oxidized layer is formed on the surface of the silicon substrate. In this case, the electrode does not react with the amorphous SiO$_2$ layer. However, the electrode is formed on the amorphous SiO$_2$ layer. Accordingly, an alloy of Ni—Cr—Al alloy or an alloy of Ni—Al alloy becomes a crystal which is not oriented. As a result, when a ferroelectric thin film is formed on the electrode composed of the alloy thin film of Ni—Cr—Al alloy or the alloy thin film of Ni—Al alloy, the ferroelectric thin film cannot have superior crystallizability. Specifically, the crystal orientation of the ferroelectric thin film cannot be made equal to the direction of the spontaneous polarization axis of the thin film, so that the ferroelectric thin film cannot exhibit sufficient characteristics as a ferroelectric thin film element.

SUMMARY OF THE INVENTION

An object of the present invention is to provide, in a a ferroelectric thin film element constructed by forming on a semiconductor substrate a ferroelectric thin film interposed between an upper electrode and a lower electrode, a ferroelectric thin film element having a structure in which a short does not easily occur between the upper and lower electrodes and the characteristics of the ferroelectric thin film can be sufficiently exhibited.

The present invention provides a ferroelectric thin film element comprising a substrate composed of (100) silicon, a MgO thin film formed on the silicon substrate and oriented in the direction (100), a lower electrode formed on the MgO thin film and composed of an alloy thin film of Ni—Cr—Al alloy or an alloy thin film of Ni—Al alloy oriented in the direction (100), a ferroelectric thin film formed on the lower electrode and composed of a ferroelectric material of PbTiO$_3$ system or Pb (Ti$_{1-x}$Zr$_x$) O$_3$ system oriented in the direction (111), and an upper electrode formed on the ferroelectric thin film.

In the present invention, an electrode composed of the alloy thin film of Ni—Cr—Al alloy or the alloy thin film of Ni—Al alloy composing the above described lower electrode exhibit superior heat resistance, is superior in high-temperature stability, and is very low in reactivity with a ceramic thin film so formed thereon as to have crystallizability in a film deposited state (Japanese Patent Laid-Open Gazette No. 276615/1991). Examples of the above described alloy of Ni—Cr—Al alloy include one having a composition containing 8 to 25% by weight of chromium and 2.5 to 8% by weight of aluminum, the remainder being composed of nickel and trace elements. In addition, examples of the above described alloy of Ni—Al alloy include one having a composition containing 2.5 to 8% by weight of aluminum, the remainder being composed of nickel and trace elements.

In the ferroelectric thin film element according to the present invention, the lower electrode must be composed of the above described particular material. The upper electrode formed on the ferroelectric thin film can be composed of an arbitrary material which can function as an electrode. If the upper electrode is composed of the same alloy thin film as the alloy thin film composing the lower electrode, however, it can be formed using the same apparatus, thereby to make it possible to simplify the producing process.

As described above, the alloy thin film of Ni—Cr—Al alloy and the alloy thin film of Ni—Al alloy have superior properties as the lower electrode in the ferroelectric thin film element. When the alloy thin film is merely formed on the silicon substrate, however, it reacts with the silicon substrate, so that it fails to function as an electrode, which is a fatal problem. Moreover, when an amorphous $SiO_2$ layer is formed as a surface oxidized layer on the surface of the silicon substrate, the above described reaction can be prevented. However, the alloy thin film of Ni—Cr—Al alloy or the alloy thin film of Ni—Al alloy becomes a polycrystal which is not oriented, thereby to make it impossible to form a ferroelectric thin film having superior crystallizability thereon.

Therefore, the inventors of the present application has found that the above described object can be attained if the MgO thin film oriented in the direction (100) is formed on the substrate composed of (100) silicon as a result of consideration so given as to allow the alloy thin film of Ni—Cr—Al alloy or the alloy thin film of Ni—Al alloy to function as an electrode and allow the ferroelectric thin film having superior crystallizability to be formed thereon.

More specifically, the MgO thin film oriented in the direction (100) is formed as a reaction preventing layer on the substrate composed of (100) silicon. Accordingly, when the alloy thin film of Ni—Cr—Al alloy or the alloy thin film of Ni—Al alloy is formed on the MgO thin film, the reaction between the alloy thin film and the silicon substrate can be reliably prevented, and the alloy thin film is allowed to sufficiently function as an electrode. Moreover, the above described alloy thin film is oriented in the direction (100) and formed. Accordingly, the ferroelectric thin film composed of the ferroelectric material of $PbTiO_3$ system or Pb $(Ti_{1-x}Zr_x)$ $O_3$ system is also formed as a ferroelectric thin film sufficiently oriented in the direction (111).

In the present invention, the reaction between the substrate composed of (100) silicon and the lower electrode composed of the alloy thin film of Ni—Cr—Al alloy or the alloy thin film of Ni—Al alloy can be reliably prevented by the MgO thin film oriented in the direction (100). Accordingly, the lower electrode composed of the above described alloy thin film can reliably function as an electrode. Moreover, the lower electrode composed of the above described alloy thin film is oriented in the direction (100). Accordingly, the ferroelectric thin film composed of the ferroelectric material of $PbTiO_3$ system or Pb $(Ti_{1-x}Zr_x)$ $O_3$ system is so constructed as to have sufficient crystallizability. Therefore, it is possible to provide a ferroelectric thin film element capable of exhibiting sufficient ferroelectric characteristics.

Therefore, the ferroelectric thin film element according to the present invention is suitably used as a pyroelectric sensor, a nonvolatile memory, and the like.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
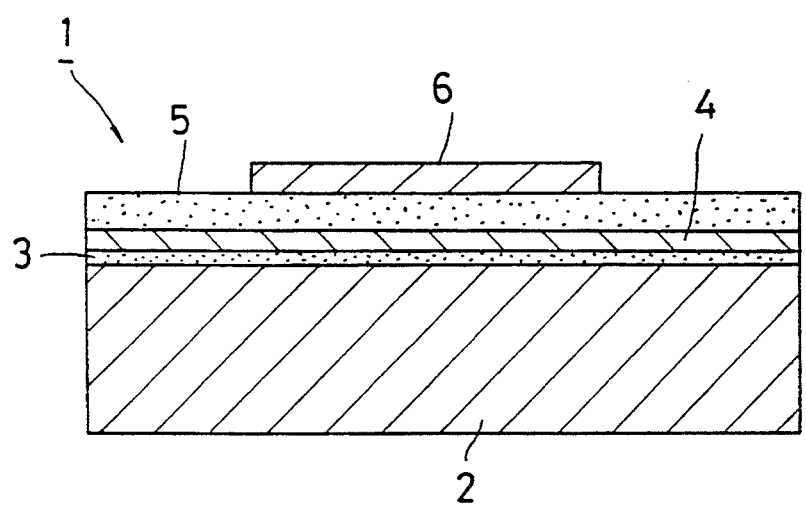
FIG. 1 is a cross sectional view showing a ferroelectric thin film in one example of the present invention.

As one example of the present invention, a ferroelectric thin film element 1 shown in FIG. 1 is produced in the following procedure. In FIG. 1, the ferroelectric thin film element 1 has a structure in which a MgO thin film 3, a lower electrode 4, a ferroelectric thin film 5, and an upper electrode 5 are formed on a substrate 2 composed of (100) silicon.

First, the MgO thin film 3 having a thickness of 3,000 A is formed on the substrate composed of (100) silicon 2 using as a target a sintered body composed of MgO by RF magnetron sputtering. The sputtering conditions are as follows.

Sputtering Conditions at the Time of Forming MgO Thin Film (1) Device used . . . RF magnetron sputter device
(2) Substrate temperature . . . 600° C.
(3) Pressure of gas at the time of sputtering . . . $5 \times 10^{-3}$ Torr
(4) Sputtering gas . . . mixed gas containing Ar and $O_2$ in the volume ratio of 10 to 1
(5) RF power . . . 200 W
(6) Sputtering time . . . 120 minutes In forming the above described MgO thin film 3, the distance between the target and the substrate is set to 160 mm, to selectively orient the MgO thin film 3 in the direction (100).

An alloy thin film of Ni—Cr—Al alloy having a thickness of 5,000 A is formed as the lower electrode 4 on the above described MgO thin film 3 by RF sputtering. The sputtering conditions are as follows.

Sputtering Conditions at the Time of Forming Lower Electrode (1) Device used . . . RF magnetron sputter device
(2) Substrate temperature . . . 400° C.
(3) Pressure of gas at the time of sputtering . . . $1 \times 10^{-2}$ Torr
(4) Sputtering gas . . . pure Ar
(5) RF power . . . 200 W
(6) Sputtering time . . . 10 minutes The above described lower electrode 4 formed by the sputtering is oriented in the crystal direction (100) and formed because the underlying MgO thin film is oriented in the direction (100).

A ferroelectric thin film 5 having a thickness of 10,000 A is formed on the above described lower electrode 4 using as a target a sintered body composed of ceramics of a $PbTiO_3$ system by RF magnetron spattering. The sputtering conditions are as follows.

Sputtering Conditions at the Time of Forming Ferroelectric Thin Film (1) Device used . . . RF magnetron sputter device
(2) Target used . . . sintered body composed of $PbTiO_3$
(3) Substrate temperature . . . 600° C.
(4) Pressure of sputtering gas . . . $6 \times 10^{-2}$ Torr (5) Sputtering gas . . . mixed gas containing Ar and O₂ in the volume ratio of 20 to 1
(6) RF power . . . 200 W
(7) Sputtering time . . . 120 minutes It is confirmed from an X-ray diffraction analysis that the ferroelectric thin film 5 formed in the above described manner is oriented in the direction (111) by the crystal orientation of the lower electrode 4. Consequently, the ferroelectric thin film 5 formed can exhibit sufficient ferroelectric characteristics. Finally, an upper electrode 6 is formed on the above described ferroelectric thin film 5, to obtain a ferroelectric thin film element 1 capable of taking out the characteristics of the ferroelectric thin film 5 by the lower electrode 4 and the upper electrode 6.

The above described upper electrode 6 can be formed by applying a conductive paste and sintering the same or by using the above described thin film forming process such as sputtering. In addition, as a material composing the upper electrode 6, a known arbitrary material can be used so long as it can function as an electrode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A ferroelectric thin film element comprising:
   a monocrystalline substrate composed of (100) crystal plane oriented silicon;
   a crystalline MgO thin film formed on said silicon substrate and oriented in the (100) crystal plane;
   a crystalline lower electrode formed on said MgO thin film and composed of an alloy thin film of Ni—Cr—Al alloy or an alloy thin film of Ni—Al alloy oriented in the (100) crystal plane;
   a crystalline ferroelectric thin film of PbTiO₃ system or Pb (Ti$_{1-x}$Zr$_x$) O₃ system formed on said lower electrode and oriented in the (111) crystal plane; and
   an upper electrode formed on said ferroelectric thin film.

2. The ferroelectric thin film element according to claim 1, wherein said lower electrode composed of the alloy thin film of Ni—Cr—Al alloy or the alloy thin film of Ni—Al alloy is deposited on said MgO thin film by sputtering.

3. The ferroelectric thin film element according to claim 1, wherein said ferroelectric thin film is deposited on said lower electrode by sputtering.

4. The ferroelectric thin film element according to claim 1, wherein said upper electrode is composed of the same alloy thin film as the alloy thin film composing said crystalline lower electrode.

5. The ferroelectric thin film element according to claim 1, wherein said lower electrode is composed of an alloy thin film of Ni—Cr—Al alloy oriented in the direction (100) crystal plane.

6. The ferroelectric thin film element according to claim 1, wherein said lower electrode is composed of an alloy thin film of Ni—Al alloy oriented in the (100) crystal plane.

7. The ferroelectric thin film element according to claim 6 in which the alloy thin film contains 2.5 to 8% aluminum.

8. The ferroelectric thin film element according to claim 7 wherein said upper electrode is composed of the same alloy thin film as the alloy thin film of said crystalline lower electrode.

9. The ferroelectric thin film element according to claim 5 wherein said alloy thin film contains 8 to 25% chromium and 2.5 to 8% aluminum.

10. The ferroelectric thin film element according to claim 9 wherein said upper electrode is composed of the same alloy thin film as the alloy thin film of said crystalline lower electrode.

* * * * *